(12) United States Patent
Jang et al.

(10) Patent No.: US 8,968,471 B2
(45) Date of Patent: Mar. 3, 2015

(54) APPARATUS FOR MANUFACTURING SILICON SUBSTRATE FOR SOLAR CELL USING CONTINUOUS CASTING AND HAVING CONTACTING SOLIDIFICATION AND STRESS RELIEVING REGIONS

(75) Inventors: Bo-Yun Jang, Daejeon (KR); Jin-Seok Lee, Daejeon (KR); Joon-Soo Kim, Daejeon (KR)

(73) Assignee: Korea Institute of Energy Research, Daejeon (KR)

( * ) Notice: Subject to any disclaimer, the term of this patent is extended or adjusted under 35 U.S.C. 154(b) by 357 days.

(21) Appl. No.: 13/115,588

(22) Filed: May 25, 2011

(65) Prior Publication Data

US 2012/0292825 A1 Nov. 22, 2012

(30) Foreign Application Priority Data

May 19, 2011 (KR) ........................ 10-2011-0047263

(51) Int. Cl.
| | | |
|---|---|---|
| C30B 15/06 | (2006.01) | |
| B22D 11/045 | (2006.01) | |
| C01B 33/037 | (2006.01) | |
| C30B 11/00 | (2006.01) | |
| C30B 28/10 | (2006.01) | |
| C30B 29/06 | (2006.01) | |

(52) U.S. Cl.
CPC ............ *B22D 11/045* (2013.01); *C01B 33/037* (2013.01); *C30B 11/001* (2013.01); *C30B 11/003* (2013.01); *C30B 28/10* (2013.01); *C30B 29/06* (2013.01)
USPC .................. 117/223; 117/11; 117/13; 117/23; 117/26; 117/27; 117/30; 117/35; 117/73; 117/81; 117/82; 117/200; 117/201; 117/202; 117/204; 117/206

(58) Field of Classification Search
CPC ...... C30B 15/00; C30B 15/002; C30B 15/06; C30B 15/34
USPC .................. 117/11, 13, 23, 26–27, 30, 35, 73, 117/81–82, 200–202, 204, 206, 223, 914, 117/922, 928, 931
See application file for complete search history.

(56) References Cited

U.S. PATENT DOCUMENTS 3,249,404 A * 5/1966 Bennett ........................ 117/209
4,329,195 A 5/1982 Kudo
(Continued)

FOREIGN PATENT DOCUMENTS

KR 10-2010-0113925 10/2010

OTHER PUBLICATIONS

Wolfgang Koch et al; "Preparation, Characterisation and Cell Processing of Bayer RGS Silicon Foils (Ribbon Growth on Substrate)"; Crystalline Silicon Solar Cells and Technologies; pp. 1254-1259; 2nd World Conference and Exhibition on Photovoltaic Solar Energy Conversion; Jul. 6-10, 1998; Vienna, Austria.

*Primary Examiner* — Kenneth A Bratland, Jr.
(74) *Attorney, Agent, or Firm* — Lowe Hauptman & Ham, LLP

(57) ABSTRACT

The present disclosure provides an apparatus for manufacturing a silicon substrate for solar cells using continuous casting, which can improve quality, productivity and energy conversion efficiency of the silicon substrate. The apparatus includes a crucible unit configured to receive raw silicon and having a discharge port, a heating unit provided to an outer wall and an external bottom surface of the crucible unit and heating the crucible unit to form molten silicon, a casting unit casting the molten silicon into a silicon substrate, a cooling unit rapidly cooling the silicon substrate, and a transfer unit disposed at one end of the cooling unit and transferring the silicon substrate. The casting unit includes a casting unit body having a casting space defined therein to be horizontally connected to the discharge port, and an assistant heating mechanism that preheats the casting unit body to control a solidification temperature of the silicon substrate.

14 Claims, 6 Drawing Sheets

(56) References Cited

U.S. PATENT DOCUMENTS

| | | | |
|---|---|---|---|
| 6,352,588 B1* | 3/2002 | Pandelisev | 117/206 |
| 7,004,226 B2* | 2/2006 | Ostlund et al. | 164/418 |
| 2003/0070605 A1* | 4/2003 | Hoshi et al. | 117/13 |
| 2008/0236665 A1 | 10/2008 | Fu et al. | |
| 2009/0139445 A1* | 6/2009 | Einhaus et al. | 117/27 |
| 2010/0089310 A1* | 4/2010 | Einhaus et al. | 117/73 |
| 2011/0168081 A1* | 7/2011 | Li et al. | 117/27 |

\* cited by examiner

APPARATUS FOR MANUFACTURING SILICON SUBSTRATE FOR SOLAR CELL USING CONTINUOUS CASTING AND HAVING CONTACTING SOLIDIFICATION AND STRESS RELIEVING REGIONS

CROSS-REFERENCE TO RELATED APPLICATION

This application claims the benefit under 35 U.S.C. §119 of Korean Patent Application No. 10-2011-0047263, filed on May 19, 2011 in the Korean Intellectual Property Office, the entirety of which is incorporated herein by reference.

BACKGROUND

1. Technical Field

The present invention relates to a technique for manufacturing a silicon substrate using continuous casting and, more particularly, to an apparatus for manufacturing a silicon substrate for solar cells using continuous casting, which can improve quality, productivity and energy conversion efficiency of the silicon substrate for solar cells, and a method for manufacturing a silicon substrate for solar cells using the same.

2. Description of the Related Art

Generally, a silicon substrate for solar cells is manufactured by solidifying molten silicon to prepare a single crystalline silicon ingot or polycrystalline silicon block, which in turn is subjected to a cutting process.

The single crystalline silicon ingot is manufactured from the molten silicon through crystal growth of a nucleus crystal by a Czochralski process.

The polycrystalline silicon block is manufactured through a unidirectional solidification process using a heat exchanger method (HEM) or Bridgman-Stockbarger method.

The prepared single crystalline silicon ingot or polycrystalline silicon block is subjected to several cutting processes to produce a silicon substrate.

FIG. 1 is a flow diagram of a conventional method of manufacturing a silicon substrate using a single crystalline silicon ingot.

Referring to FIG. 1, the single crystalline silicon ingot is subjected to the following processes to produce a silicon substrate.

First, cropping is performed to cut a shoulder and a tail of the ingot. Second, grinding is performed to grind the ingot to a desired size, that is, a desired diameter. Thirdly, flattening is performed to form a flat or notch portion on the ingot for recognition of a direction. Fourthly, slicing is performed to cut the ingot into a wafer shape. Fifthly, edge profiling is performed to process an edge of the wafer into a rounded shape to prevent breakage. Sixthly, lapping is performed to polish both sides of the wafer for removal of slicing defects, flatness enhancement and thickness adjustment. Seventhly, etching is performed to chemically remove a defect layer from the surface of the wafer. Last, polishing is performed to form a mirror surface(s) having excellent flatness on one or both sides of the wafer through a chemical or physical process.

In this case, about 50% of the ingot is removed as Kerf-loss through cropping, grinding, flatting, and slicing.

FIG. 2 is a flow diagram of a conventional method of manufacturing a silicon substrate using a polycrystalline silicon block.

Referring to FIG. 2, the polycrystalline silicon block is subjected to the following processes to produce a silicon substrate.

First, blocking is performed to cut the polycrystalline silicon block to a desired size. Second, cropping is performed to cut the head and tail of the silicon block. Thirdly, edge grinding is performed to process an edge of the silicon block into a rounded shape. Fourthly, slicing is performed to cut the silicon block into a wafer shape. Fifthly, polishing is performed to form a mirror surface(s) having excellent flatness on one or both sides of the wafer through a chemical or physical process.

Here, the silicon block undergoes 40% Kerf-loss through blocking, cropping, edge groundings, and slicing.

As such, when manufacturing the silicon substrate using the single crystalline silicon ingot or polycrystalline silicon block, 40% or more Kerf-loss occurs through several cutting processes. Thus, Kerf-loss causes an increase in manufacturing costs of the silicon substrate, which is a main element of a solar cell.

Meanwhile, in a recent process for manufacturing a silicon substrate for solar cells, a thin silicon substrate is directly obtained from molten silicon without the process of preparing the single crystalline silicon ingot or polycrystalline silicon ingot and the process of cutting the ingot or block, so that Kerf-loss can be fundamentally prevented in manufacture of the silicon substrate for solar cells.

In other words, this method allows the solidified silicon substrate to be directly manufactured from molten silicon. Thus, this method reduces manufacturing costs of the silicon substrate by up to 50% by eliminating the processes of preparing and cutting the ingot.

Currently, a technique for directly manufacturing a silicon substrate for solar cells can be classified into a vertical growth type and a horizontal growth type. The vertical growth type includes an edge-defined film-fed growth (EFG) process, a string ribbon (SR) process, and the like, and the horizontal growth type includes a ribbon growth on substrate (RGS) process, a silicon film process, a crystallization on dipped substrate (CDS) process, and the like.

FIG. 3 shows a schematic view of a solidification method in direct manufacture of a silicon substrate from molten silicon through the RGS process and microstructure of the silicon substrate manufactured by this method.

A technique for manufacturing a silicon substrate through the RGS process enables direct manufacture of the silicon substrate through horizontal growth. This technique secures a high production rate by rapidly removing latent heat from the manufactured silicon substrate through a lower substrate, providing higher productivity than any other techniques known in the art for direct manufacture of a silicon substrate for solar cells.

Referring to FIG. 3, when manufacturing a silicon substrate for solar cells using this technique, a solid/liquid interface is formed in the vertical direction and is at a right angle to the horizontal growth direction of the silicon substrate, thereby forming an inclined surface. As a result, the substrate has dense crystal grains and solidification of silicon proceeds along the inclined solid/liquid interface, so that impurities are segregated on the surface of the silicon substrate, causing quality deterioration of the silicon substrate.

When such a silicon substrate is used as a substrate for a solar cell, however, high energy conversion efficiency cannot be expected due to low quality of the substrate.

For the vertical growth technique, since the crystal growth direction is parallel to the proceeding direction, the crystal is grown in the longitudinal direction to have a large size, thereby improving energy conversion efficiency of the solar cell. However, despite such a merit, the vertical growth technique has a very low solidification rate, providing a disadvantage in terms of productivity.

On the other hand, for the horizontal growth technique, since the crystal growth direction is vertical to the proceeding direction, the crystal is grown in the thickness direction of the substrate to have a small size and undergoes precipitation of impurities, thereby causing lower energy conversion efficiency than the vertical growth technique. However, the horizontal growth technique can efficiently remove latent heat through the wide substrate, thereby enabling rapid growth of the substrate.

As such, such conventional methods of directly manufacturing a silicon substrate compromise productivity of the silicon substrate and energy conversion efficiency. Therefore, there is a need for a method for manufacturing a silicon substrate for solar cells, which can improve both productivity and quality of the silicon substrate.

BRIEF SUMMARY

One aspect of the invention is to provide an apparatus for manufacturing a silicon substrate for solar cells, which can facilitate control of impurities having a negative influence upon energy conversion efficiency and permits easy control of a temperature gradient for growth of a large crystal grain by maintaining a solid/liquid interface of the silicon substrate perpendicular to a growth direction of the silicon substrate, when manufacturing the silicon substrate using continuous casting that facilitates continuous production and property control of the silicon substrate.

Another aspect of the invention is to provide a method of manufacturing high quality silicon substrate using the apparatus.

In accordance with one embodiment, there is provided an apparatus for manufacturing a silicon substrate for solar cells using continuous casting, which allows easy temperature control. The apparatus includes a crucible unit configured to receive raw silicon and having a discharge port penetrating one sidewall thereof to be disposed in a horizontal direction; a heating unit provided to an outer wall and an external bottom surface of the crucible unit and heating the crucible unit to melt the raw silicon in the crucible unit to form molten silicon; a casting unit casting the molten silicon discharged through the discharge port of the crucible unit into a silicon substrate; a cooling unit rapidly cooling the cast silicon substrate; and a transfer unit disposed at one end of the cooling unit and transferring the solidified silicon substrate. Here, the casting unit includes a casting unit body having a casting space defined therein to be horizontally connected to the discharge port of the crucible unit, and an assistant heating mechanism that preheats the casting unit body to control a solidification temperature of the silicon substrate.

In accordance with another embodiment, there is provided a method of manufacturing a silicon substrate for solar cells using continuous casting, which allows easy temperature control. The method includes (a) supplying raw silicon to a crucible unit, followed by heating the raw silicon using a heating unit; (b) discharging molten silicon through a discharge port of the crucible unit; (c) casting the molten silicon into a silicon substrate in a casting space of a casting unit connected to the discharge port of the crucible unit; (d) rapidly cooling the cast silicon substrate in a cooling unit; and (e) transferring the cooled silicon substrate in a horizontal direction.

As such, the apparatus according to the embodiment may improve productivity of the silicon substrate for solar cells using continuous casting, which provides high productivity and facilitates property control, and provides a large crystal grain to the resultant silicon substrate by maintaining the crystal growth direction of the silicon substrate perpendicular to the growth direction of the substrate.

Accordingly, when the silicon substrate manufactured using the apparatus according to the embodiment is applied to a substrate for solar cells, it is possible to provide a solar cell having high energy conversion efficiency with low manufacturing costs.

BRIEF DESCRIPTION OF THE DRAWINGS

The above and other aspects, features, and advantages of the invention will become apparent from the detailed description of the following embodiments in conjunction with the accompanying drawings.

DETAILED DESCRIPTION

Figure 1:
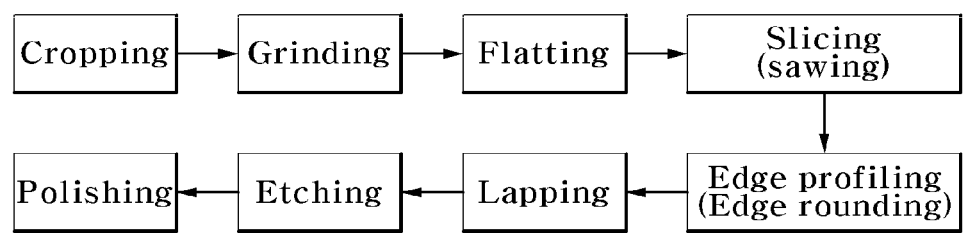
FIG. 1 is a flow diagram of a conventional method of manufacturing a silicon substrate using a single crystalline silicon ingot.
Figure 2:
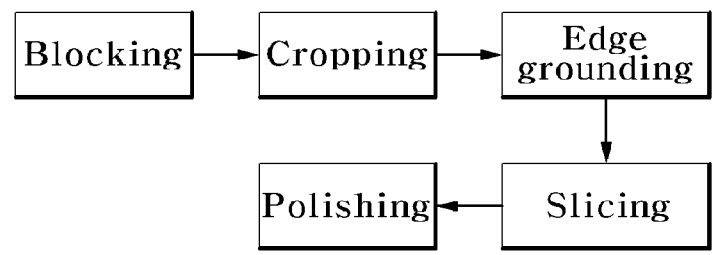
FIG. 2 is a flow diagram of a conventional method of manufacturing a silicon substrate using a polycrystalline silicon block.
Figure 3:
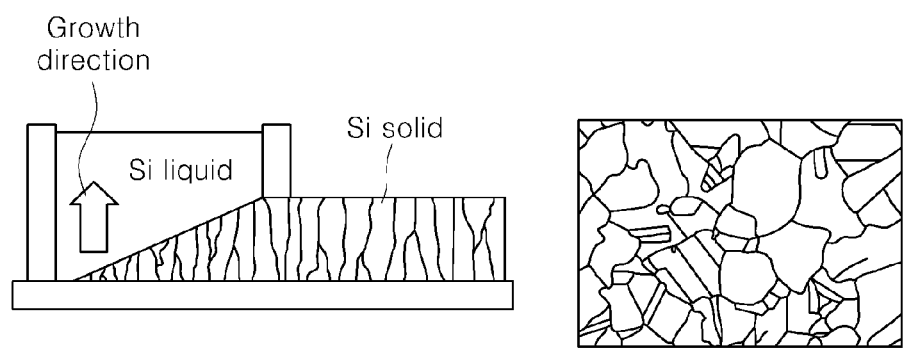
FIG. 3 shows a schematic view of a conventional rapid solidification method and microstructure of a silicon substrate manufactured by this method.

Exemplary embodiments of the invention will now be described in detail with reference to the accompanying drawings. It should be understood that the present invention is not limited to the following embodiments and may be embodied in different ways, and that the embodiments are given to provide complete disclosure of the invention and to provide thorough understanding of the invention to those skilled in the art. The scope of the invention is limited only by the accompanying claims and equivalents thereof. Like components will be denoted by like reference numerals throughout the specification.

Next, an apparatus for manufacturing a silicon substrate for solar cells using continuous casting, which allows easy temperature control, according to an exemplary embodiment of the invention, and a method of manufacturing a silicon substrate using the same will be described with reference to the accompanying drawings.

In manufacture of a silicon substrate for solar cells from molten silicon, productivity is determined by a solidification rate of the molten silicon and energy conversion efficiency is determined depending upon the microstructure of the silicon substrate. Thus, productivity increases with increasing solidification rate, and energy conversion efficiency increases with increasing crystal grain size.

Figure 4:
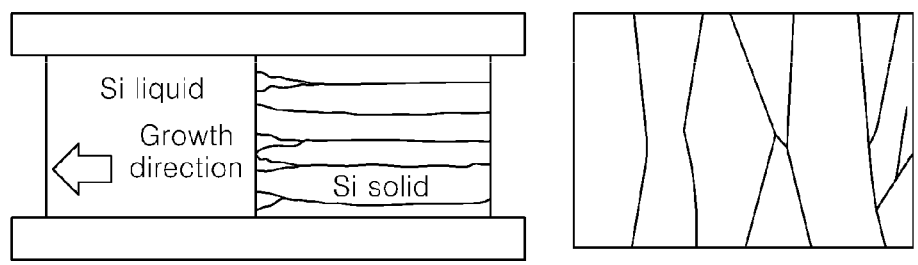
FIG. 4 shows a schematic view of a solidification method using continuous casting according to an embodiment of the present invention and microstructure of a silicon substrate manufactured by this method.

FIG. 4 shows a schematic view of a solidification method using continuous casting according to an exemplary embodiment of the invention and microstructure of a silicon substrate manufactured by this method Referring to FIG. 4, during manufacture of a silicon substrate using continuous casting according to the invention, a growth direction of a silicon crystal is kept horizontal to a growth direction of the silicon substrate. Thus, as shown in the right side of FIG. 4, not only do the resultant crystal grains of the silicon substrate have a large size, but also impurities contained in the molten silicon are moved towards the molten silicon (Si liquid) by a vertical solid/liquid interface, thereby providing a high quality silicon substrate.

Further, in manufacture of the silicon substrate for solar cells using continuous casting, a rapid solidification rate may be obtained through contact with a casting unit.

As such, since the technique for manufacturing a silicon substrate for solar cells using continuous casting according to the invention may improve both productivity and quality of the silicon substrate, which are compensated in the art, the technique may be applied to a substrate for a solar cell, which requires price competitiveness and high energy conversion efficiency.

Figure 5:
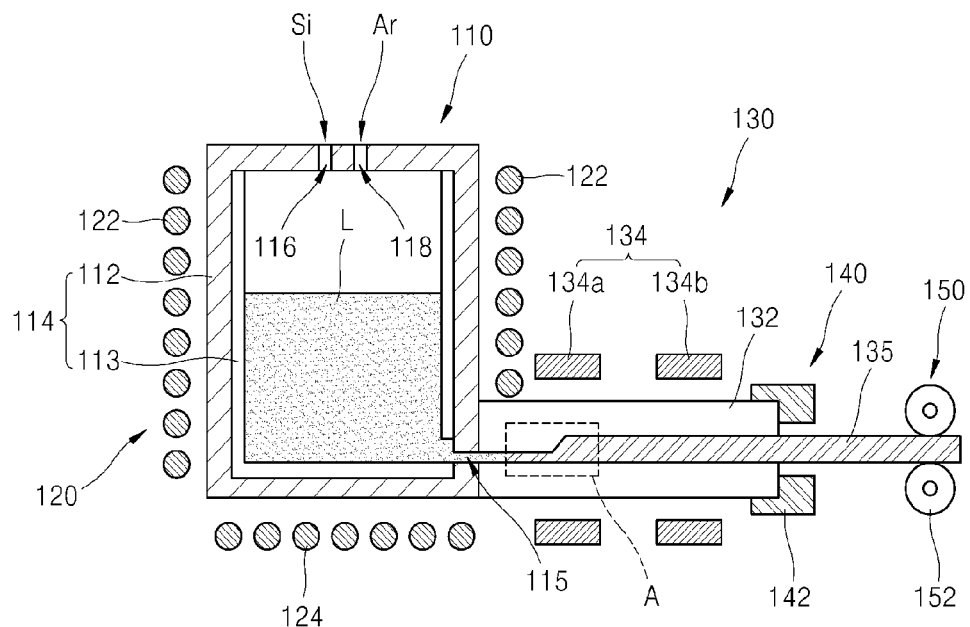
FIG. 5 is a sectional view of an apparatus for manufacturing a silicon substrate for solar cells using continuous casting according to an exemplary embodiment of the present invention.

FIG. 5 is a sectional view of an apparatus for manufacturing a silicon substrate for solar cells using continuous casting according to an embodiment of the invention.

Referring to FIG. 5, the apparatus for manufacturing silicon substrate for solar cells using continuous casting 100 according to the embodiment includes a crucible unit 110, a heating unit 120, a casting unit 130, a cooling unit 140, and a transfer unit 150.

Crucible Unit

The crucible unit 110 includes a double crucible 114, a raw silicon gate 116, a gas supply port 118 and a discharge port 115. Raw silicon is supplied into the crucible unit 110.

The double crucible 114 includes a graphite crucible 112 defining a closed space and a quartz crucible 113 inserted into the graphite crucible 112.

Here, the graphite crucible 112 may have a rectangular cross-section and defines a space therein. The quartz crucible 113 is fitted into the graphite crucible 112 and receives the raw silicon. The quartz crucible 113 is made of quartz, which exhibit superior thermal resistance to graphite and has low thermal expansion and high chemical stability.

As such, as the double crucible 114 is constituted by the graphite crucible 112 and the quartz crucible 113, the quartz crucible 113 inserted into the graphite crucible 112 serves as a shielding member that prevents carbon and metallic impurities of the graphite crucible from flowing into molten silicon L to prevent contamination of the molten silicon L even when the raw silicon is heated to about 1412° C. or more.

The raw silicon gate 116 is formed through the ceiling of the double crucible 114. The raw silicon is injected into the double crucible through the raw silicon gate 116.

The gas supply port 118 is formed through the ceiling of the double crucible 114 to be separated from the raw silicon gate 116. An inert gas such as argon is injected into the double crucible through the gas supply port 118.

The inert gas may be supplied through the gas supply port 118 independent of the gate through which the raw silicon is supplied into the crucible unit. Alternatively, although not shown in the drawings, the inert gas may be supplied together with the raw silicon into the double crucible 114 through the raw silicon gate 116.

Then, the inert gas compresses the interior of the double crucible 114 to induce smooth discharge of the molten silicon L through the discharge port 115. Since the fluidity of the molten silicon L discharged through the discharge port 115 is lowered with decreasing temperature of the molten silicon L, compression of the inert gas becomes activated as the temperature of the molten silicon L decreases. Conversely, since the fluidity of the molten silicon L is increased with increasing temperature of the molten silicon L, compression of the inert gas becomes inactivated as the temperature of the molten silicon L increases.

Here, as the flux of the inert gas increases, the pressure of the inert gas also increases. Although the pressure increase by the inert gas can lead to enhancement of discharge, an excessive increase of the pressure by the inert gas creates pores in the molten silicon L, thereby reducing the density of the resultant silicon substrate. Accordingly, the flux of the inert gas may be adjusted to provide an internal pressure of 1~5 bars inside the crucible unit. If the internal pressure is less than 1 bar during supply of the inert gas, compression of the inert gas is low, making it difficult to obtain efficient discharge of the molten silicon L. On the contrary, if the internal pressure exceeds 5 bars, pores are created in the molten silicon L and lowers the density of the silicon substrate while excessively increasing the discharge rate, making it difficult to control the process.

The discharge port 115 is formed to penetrate one sidewall of the double crucible 114 substantially in the horizontal direction. The discharge port 115 may be configured to be located adjacent to a lower bottom surface of the double crucible 114 at the one sidewall thereof. The discharge port 115 is configured to be connected to a casting space 131 (see FIG. 6) of the casting unit 130 described below.

The discharge port 115 may have a thickness of 100 to 400 μm. The thickness of the discharge port 115 determines the thickness of the silicon substrate to be manufactured and productivity upon continuous casting. If the thickness of the discharge port 115 is less than 100 μm, it is difficult to control a solid/liquid interface formed in the vertical direction. Further, mechanical strength of the solidified substrate is lowered to make the silicon substrate broken during continuous production, thereby making it difficult to control the process. If the thickness of the discharge port 115 exceeds 400 μm, there is a problem in that the production rate is lowered due to extended solidification time, although the solid/liquid interface can be easily controlled.

Heating Unit

The heating unit 120 is provided to an outer wall and an exterior bottom surface of the crucible unit 110 and heats the crucible unit 110 to form molten silicon L by melting raw silicon in the double crucible 114.

The heating unit 120 includes a first heating mechanism 122 disposed along the outer wall of the double crucible 114 and a second heating mechanism 124 disposed along the exterior bottom surface of the double crucible 114. In this case, the first heating mechanism 122 may surround the outer wall of the double crucible 114 or may be inserted into an inner wall of the double crucible 114. Likewise, the second heating mechanism 124 may be disposed along the bottom surface of the double crucible 114 or be inserted into the bottom surface of the double crucible 114. Here, the first heating mechanism 122 and the second heating mechanism 124 may be separately controlled.

The first and second heating mechanisms 122, 124 may be realized by a heater or an induction coil.

If the double crucible 114 including the graphite crucible 112 having a rectangular cross-section and the quartz crucible 113 is heated using only a heating unit disposed along the outer wall of the double crucible 114, temperature deviation can occur along the double crucible 114 due to the non-symmetrical structure of the double crucible. In particular, since the temperature deviation is severe near an internal bottom surface of the double crucible 114, a central region of the double crucible 114 corresponding to the internal bottom surface has the lowest temperature. As a result, the temperature deviation on the internal bottom surface of the double crucible 114 causes temperature deviation in the molten silicon L discharged through the discharge port, so that stress non-uniformity occurs and causes the silicon substrate to break or be damaged when the molten silicon L is solidified to form the silicon substrate.

In this embodiment, however, the heating unit 120 is constituted by the first heating mechanism 122 mounted on the outer wall of the double crucible 114 and the second heating mechanism 124 mounted on the external bottom surface of the double crucible 114 to control the temperature at each portion of the crucible unit, thereby enabling more precise control of the molten silicon L.

As such, since the heating unit 120 divided into two regions can minimize temperature deviation on the outer wall and the bottom surface of the double crucible 114, it is possible to achieve uniform control of the temperature of the molten silicon L.

Here, the surface temperature of the molten silicon L heated within the double crucible 114 may be maintained at 1300~1500° C. If the surface temperature of the molten silicon L is less than 1300° C., there is a possibility of solidification of the molten silicon L before discharge. If the surface temperature of the molten silicon L exceeds 1500° C., there is a problem of an increase in manufacturing costs without an additional temperature elevation effect.

Casting Unit

The casting unit 130 is disposed at one side of the crucible unit 110 and is horizontally connected to the discharge port 115 of the crucible unit 110.

The casting unit 130 includes a casting unit body 132 having a casting space 131 (see FIG. 6), which is defined in the body 132 and is horizontally connected to the discharge port 115, and an assistant heating mechanism 134 which preheats the casting unit body 132 to control the solidification temperature of the silicon substrate 135.

Figure 6:
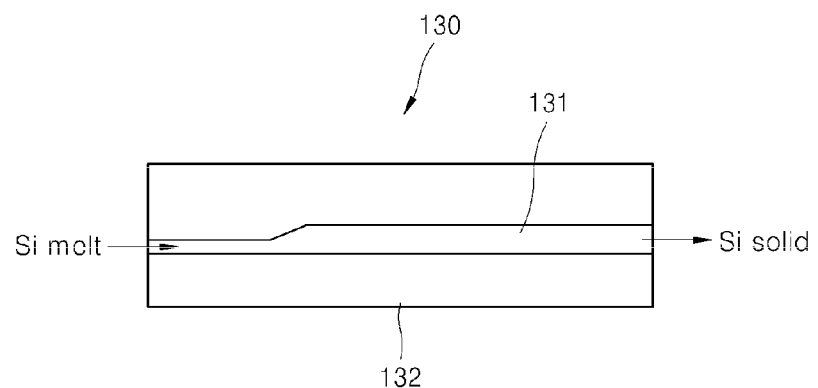
FIG. 6 is an enlarged sectional view of Part A of FIG. 5.

As shown in FIG. 6, the casting space 131 is a hollow space formed by machining the interior of the casting unit body 131 and determines the size of the silicon substrate 135 to be manufactured. Here, the molten silicon L discharged through the discharge port 115 is cooled and solidified in the casting space 131.

Figure 7:
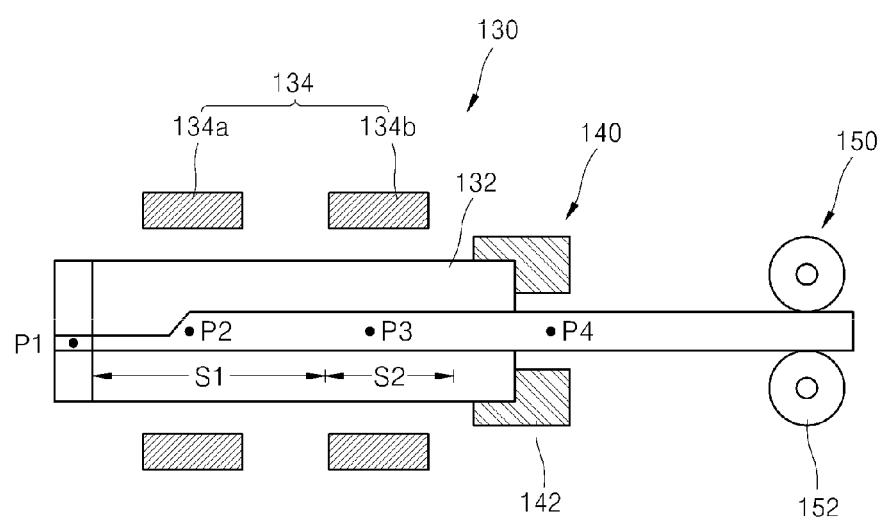
FIG. 7 is an enlarged view of a casting unit of FIG. 5.

Referring to FIG. 7, the casting space 131 may be divided into a solidification region S1 for cooling and solidifying the silicon substrate 135 and a stress relieving region S2 for relieving residual stress of the solidified silicon substrate 135.

The solidification region S1 is disposed at a front region of the casting unit 130 and is connected to the discharge port 115. In the solidification region S1, the cast silicon substrate 135 is subjected to primary solidification. Here, the solidification region S1 may have a greater thickness than the discharge port 115. This configuration of the solidification region S1 can secure a space for relieving residual thermal stress in the silicon substrate 135 after solidification of the silicon substrate 135.

Further, the stress relieving region S2 is disposed at a rear region of the casting unit 130 and is connected to the solidification region S1. In the stress relieving region S2, the case silicon substrate 135 is subjected to secondary solidification to relieve stress of the solidified silicon substrate 135.

The assistant heating mechanism 134 prevents rapid cooling of the molten silicon L discharged through discharge port 115 during manufacture of the silicon substrate 135, thereby improving the quality of the silicon substrate 135.

The assistant heating mechanism 134 may include a first assistant heating mechanism 134a and a second assistant heating mechanism 134b. Although not shown in the drawings, the assistant heating mechanism 134 may further include a third assistant heating mechanism, as needed.

The first assistant heating mechanism 134a is positioned corresponding to the solidification region S1 and primarily heats the cast silicon substrate 135. The second assistant heating mechanism 134b is positioned corresponding to the stress relieving region S2 and secondarily heats the cast silicon substrate 135. Each of the first and second assistant heating mechanisms 134a, 134b may be realized using a heater or an induction coil.

As shown in FIG. 5, the first and second assistant heating mechanisms 134a, 134b may be mounted on an outer side of the casting unit body 132 without being limited thereto. Alternatively, the first and second assistant heating mechanisms 134a, 134b may be mounted inside the casting unit body 132.

Here, the primary heating temperature may be kept at 900~1100° C. and the secondary heating temperature may be kept at 700~900° C. In this embodiment, the temperature of the molten silicon L is maintained at about 1300~1500° C. Further, the solidification temperature is in the range of about 1000° C.~1400° C. and a solidification completing temperature is about 1000° C. or less.

Accordingly, controlling temperature descending characteristics in the range of 700° C.~1100° C., which is the primary and secondary heating temperature range, is important in determination of grain size and residual stress, which are main factors determining solar cell efficiency.

If the apparatus is designed to allow rapid cooling of the molten silicon L discharged through the discharge port 115 without using the assistant heating mechanism 134, the silicon substrate 135 manufactured by the casting unit 130 has a relatively small crystal grain size and large residual stress, so that there is a problem of rapid deterioration in energy conversion efficiency when the silicon substrate is used for a solar cell.

In this embodiment of the invention, however, since the primary and secondary heating temperatures of the solidification region S1 and the stress relieving region S2 can be controlled using the first and second assistant heating mechanisms 134a, 134b, it is possible to prevent rapid temperature decrease. As a result, the apparatus according to the embodiment may manufacture the silicon substrate 135 to have a relatively large crystal grain size while minimizing residual stress in the manufactured silicon substrate.

Cooling Unit

The cooling unit 140 rapidly cools the silicon substrate 135 cast through the casting unit 130 to 200° C. or less. Here, the cooling unit 140 is disposed at the rear end of the casting unit 130 and controls the final temperature of the solidified silicon substrate 135. The cooling unit 140 may be realized by a cooling jacket 142 employing refrigerant.

The silicon substrate 135 discharged through the casting unit 130 has a temperature of about 500° C. If the silicon substrate 135 discharged through the casting unit 130 is not rapidly cooled to 200° C. or less, deformation can occur on the surfaces of a pair of transfer rollers 152, which are made of a polymer such as Teflon to minimize impact to the silicon substrate 135. Thus, it is desirable that the silicon substrate 135 discharged through the casting unit 130 is rapidly cooled to 200° C. or less using the cooling unit 140.

Transfer Unit

The transfer unit 150 is located at the rear end of the cooling unit 140 and horizontally transfers the solidified silicon substrate 135 discharged from the casting unit 130. For this purpose, the transfer unit 150 may include the pair of transfer rollers 152 rotating in opposite directions. Here, the transfer speed of the solidified silicon substrate may be controlled to coincide with the solidification rate of the molten silicon through drive of the transfer rollers 152 in the transfer unit 150.

The transfer unit 150 may be moved at a speed of 50~1000 cm/min. If the speed of the transfer unit 150 is less than 50 cm/min, the silicon substrate 135 can be excessively thickened. If the speed exceeds 1000 cm/min, the silicon substrate 135 can be excessively thinned.

Figure 8:
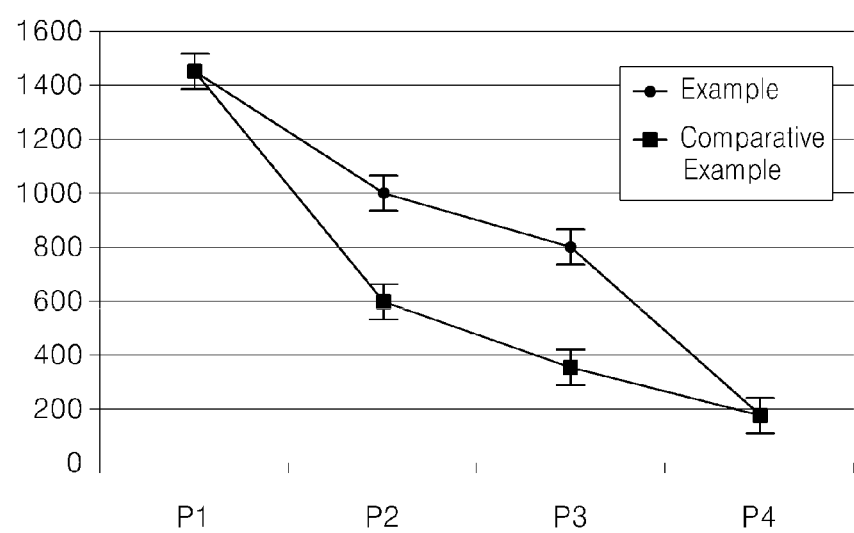
FIG. 8 is a graph depicting temperature variation according to positions in a casting unit in an example and a comparative example.

FIG. 7 is an enlarged view of the casting unit of FIG. 5 and FIG. 8 is a graph depicting temperature variation according to positions in the casting unit in an example and a comparative example. Here, silicon substrates of the example and the comparative example were manufactured using the apparatus shown in FIG. 5. For the example, an assistant heating mechanism was provided to the casting unit and the temperature of the silicon substrate was measured at portions P1, P2, P3 and P4, and for the comparative example, the assistant heating mechanism was not provided to the casting unit and the temperature of the silicon substrate was measured at portions P1, P2, P3 and P4.

Referring to FIGS. 7 and 8, it can be seen that the silicon substrate of the comparative example manufactured without the assistant heating mechanism underwent severe temperature deviation between the portions P1 and P2. In the comparative example, the silicon substrate manufactured through the casting unit has a relatively small crystal grain size and large residual stress due to rapid decrease in temperature of the molten silicon discharged through the discharge port.

On the contrary, in the example using the assistant heating mechanism, it can be seen that temperature deviation between the portions P1, P2, P3 and P4 is relatively small and has a gentle slope. Accordingly, since it is possible to prevent rapid decrease in temperature of the molten silicon discharged from the discharge port through temperature control at the portions P1, P2, P3 and P4, the silicon substrate manufactured through the casting unit has a relatively large crystal grain size and can minimize residual stress in the silicon substrate.

As described above, the apparatus for manufacturing a silicon substrate for solar cells according to the embodiment may improve productivity through continuous casting, which facilitates control of productivity and properties.

In particular, the first heating mechanism for heating the outer wall of the double crucible and the second heating mechanism for heating the external bottom surface of the double crucible minimize temperature deviation of the molten silicon in the double crucible. Further, the first assistant heating mechanism and the second assistant heating mechanism are positioned corresponding to the solidification region and the stress relieving region in the casting unit, so that the molten silicon is prevented from being rapidly cooled during manufacture to allow the resultant silicon substrate to have a large crystal grain size, thereby improving quality of the silicon substrate.

Accordingly, when the silicon substrate manufactured using the apparatus according to the embodiment is applied to a substrate for a solar cell, it is possible to provide a solar cell having high energy conversion efficiency with low manufacturing costs.

Figure 9:
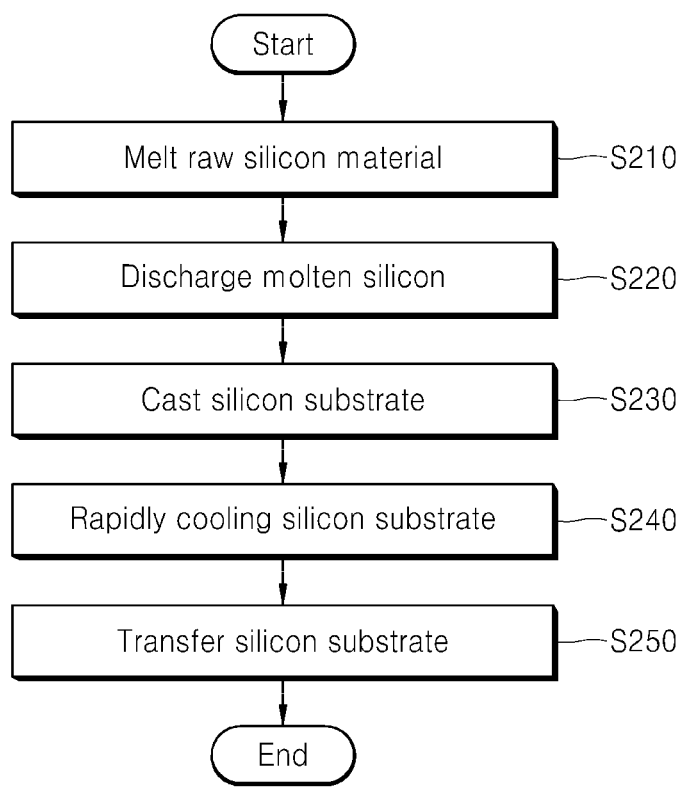
FIG. 9 is a flowchart of a method of manufacturing a silicon substrate for solar cells using continuous casting according to an embodiment of the present invention.

FIG. 9 is a flowchart of a method of manufacturing a silicon substrate for solar cells using continuous casting according to an exemplary embodiment of the invention.

Referring to FIG. 9, the method of manufacturing a silicon substrate for solar cells includes melting raw silicon in S210, discharging molten silicon in S220, casting a silicon substrate in S230, rapidly cooling the silicon substrate in S240, and transferring the silicon substrate in S250. In this embodiment, the method is performed using the apparatus according to the embodiment of the invention.

In operation S210 of melting a raw material, raw silicon is placed in the crucible unit and melted by a heating unit. Here, the temperature of the molten silicon is uniformly controlled using the first heating mechanism mounted on the outer wall of the double crucible and the second heating mechanism mounted on the external bottom surface of the double crucible.

In operation S220 of discharging the molten silicon, the molten silicon is discharged through the discharge port of the crucible unit.

Here, in order to increase fluidity of the molten silicon, the molten silicon may be discharged through the discharge port of the crucible unit at a temperature of 1350~1500° C. In this case, to induce discharge of the molten silicon, an inert gas is supplied into the crucible unit to compress the molten silicon. The inert gas may be supplied to keep an internal pressure of the crucible unit in the range 1~5 bars.

In operation S230 of casting the silicon substrate, the molten silicon is cast into the silicon substrate in a casting space of the casting unit connected to the discharge port.

The operation S230 of casting the silicon substrate may include primary solidification of the cast silicon substrate (not shown) and secondary solidification of the cast silicon substrate to relieve stress of the solidified silicon substrate.

Here, the primary heating temperature may be kept at 900~1100° C. and the secondary heating temperature may be kept at 700~900° C. At this time, while the molten silicon passes the solidification region of the casting unit, solidification of the molten silicon proceeds, with a solid/liquid interface of the molten silicon maintained in the vertical direction, and the solidified silicon substrate relieves thermal stress while passing through the stress relieving region of the casting unit.

In operation S240 of rapidly cooling the silicon substrate, the silicon substrate produced through the casting unit is rapidly cooled by the cooling unit. The cooling unit rapidly cools the silicon substrate to 200° C. or less to prevent deformation of the surfaces of the transfer rollers, which are made of a polymer such as Teflon to minimize impact to the silicon substrate 135.

In operation S250 of transferring the silicon substrate, the cooled silicon substrate is transferred in the horizontal direction. Here, the solidification rate of the molten silicon is equal to the transfer speed of the silicon substrate, allowing continuous casting of the silicon substrate.

In this manner, the method for manufacturing a silicon substrate for solar cells using continuous casting can be completed.

As such, when the silicon substrate manufactured using the method according to the embodiment of the invention is applied to a substrate for solar cells, it is possible to provide a solar cell having high energy conversion efficiency with low manufacturing costs.

Although some embodiments have been described herein, it should be understood by those skilled in the art that these embodiments are given by way of illustration only, and that various modifications, variations, and alterations can be made without departing from the spirit and scope of the invention. Therefore, the scope of the invention should be limited only by the accompanying claims and equivalents thereof.

What is claimed is:

1. An apparatus for manufacturing a silicon substrate using continuous casting, the apparatus comprising:
    a crucible unit configured to receive raw silicon and having a discharge port, the discharge port penetrating one sidewall of the crucible unit and disposed in a horizontal direction;
    heating units disposed adjacent to an outer wall of the crucible unit and an external bottom surface of the crucible unit and configured to heat the crucible unit to melt the raw silicon in the crucible unit to form molten silicon;
    a casting unit configured to cast the molten silicon discharged through the discharge port of the crucible unit into a silicon substrate, the casting unit comprising:
        a casting unit body having a casting space defined therein and horizontally connected to the discharge port of the crucible unit,
        an assistant heating mechanism configured to preheat the casting unit body to control a solidification temperature of the silicon substrate;
    a cooling unit configured to cool the cast silicon substrate to form a solidified silicon substrate; and
    a transfer unit disposed at one end of the cooling unit and configured to transfer the solidified silicon substrate,
    wherein the casting space comprises:
        a solidification region configured to primarily solidify the cast silicon substrate, and
        a stress relieving region configured to secondarily solidify the cast silicon substrate to relieve stress of the cast silicon substrate,
    wherein the solidification region and the stress relieving region are continuous to each other,
    wherein the casting unit body comprises a first portion connected to the discharge port and a second portion connected to the cooling unit, and the casting space in the first portion has a smaller diameter than a diameter of the casting space in the second portion, and
    wherein a bottom of the first portion and a bottom of the second portion are connected by a straight line, and a top of the first portion and a top of the second portion are connected by an angled line which is oblique relative to the straight line.

2. The apparatus of claim 1, wherein the discharge port has a diameter of 100~400 μm.

3. The apparatus of claim 1, wherein the crucible unit comprises:
    a double crucible comprising a graphite crucible defining a closed space and a quartz crucible inserted into the graphite crucible;
    a raw silicon gate which penetrates the ceiling of the double crucible and through which the raw silicon is to be supplied into the double crucible; and
    a gas supply port which penetrates the ceiling of the double crucible and through which an inert gas is to be supplied into the double crucible, the gas supply port is separated from the raw silicon gate.

4. The apparatus of claim 3, wherein the gas supply port is configured to supply the inert gas into the double crucible to compress the molten silicon to induce discharge of the molten silicon.

5. The apparatus of claim 1, wherein the heating units comprise:
    a first heating mechanism disposed along the outer wall of the crucible unit, and
    a second heating mechanism disposed along the external bottom surface of the crucible unit,
    wherein the first and second heating mechanisms are separately controllable.

6. The apparatus of claim 5, wherein each of the first and second heating mechanisms is one of a heater and an induction coil.

7. The apparatus of claim 1, wherein the casting unit further comprises an assistant heating mechanism, the assistant heating mechanism comprising:
    a first assistant heating mechanism positioned corresponding to the solidification region to primarily heat the cast silicon substrate, and
    a second assistant heating mechanism positioned corresponding to the stress relieving region to secondarily heat the cast silicon substrate.

8. The apparatus of claim 7, wherein each of the first and second assistant heating mechanisms is one of a heater and an induction coil.

9. The apparatus of claim 1, wherein the transfer unit comprises a pair of rollers configured to rotate in opposite directions.

10. The apparatus of claim 1, wherein the solidification region has a greater diameter than a diameter of the discharge port.

11. The apparatus of claim 1, wherein the solidification region and the stress relieving region are configured to be heated at different temperatures.

12. The apparatus of claim 7, wherein the first assistant heating mechanism is configured to heat the cast silicon substrate at a temperature of 900~1100° C., and the second assistant heating mechanism is configured to heat the cast silicon substrate at a temperature of 700~900° C.

13. The apparatus of claim 1, wherein
    the angled line is connected with the top of the first portion at a first angle, and
    the angled line is connected with the top of the second portion at a second angle.

14. The apparatus of claim 13, wherein the first and second angles are the same.

* * * * *